United States Patent
Kwon et al.

(10) Patent No.: US 11,778,865 B2
(45) Date of Patent: Oct. 3, 2023

(54) DISPLAY PANEL

(71) Applicant: Samsung Display Co., Ltd., Yongin-Si (KR)

(72) Inventors: Ohjune Kwon, Hwaseong-si (KR); Junghan Seo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 86 days.

(21) Appl. No.: 17/323,063

(22) Filed: May 18, 2021

(65) Prior Publication Data
US 2022/0059626 A1 Feb. 24, 2022

(30) Foreign Application Priority Data

Aug. 24, 2020 (KR) ........................ 10-2020-0105897

(51) Int. Cl.
*H10K 59/122* (2023.01)
*H10K 50/844* (2023.01)
*H10K 102/00* (2023.01)
*G09F 9/30* (2006.01)

(52) U.S. Cl.
CPC ........... *H10K 59/122* (2023.02); *G09F 9/301* (2013.01); *H10K 50/844* (2023.02); *H10K 2102/311* (2023.02)

(58) Field of Classification Search
CPC . H01L 51/5253; H01L 27/3246; G09F 9/301; H10K 59/122; H10K 50/844; H10K 2102/311
See application file for complete search history.

(56) References Cited

U.S. PATENT DOCUMENTS

| | | | |
|---|---|---|---|
| 9,271,371 B2 | 2/2016 | Lee | |
| 9,685,629 B2 | 6/2017 | Park | |
| 2019/0181205 A1* | 6/2019 | Kim | H01L 27/3258 |
| 2019/0237703 A1* | 8/2019 | Kim | H01L 51/5012 |
| 2020/0127233 A1* | 4/2020 | Sung | H01L 51/52 |
| 2020/0161582 A1* | 5/2020 | Choi | H01L 51/5253 |
| 2021/0184169 A1* | 6/2021 | Seo | H01L 27/3262 |
| 2021/0234125 A1* | 7/2021 | Sung | H01L 27/3258 |

FOREIGN PATENT DOCUMENTS

| | | | |
|---|---|---|---|
| KR | 10-2016-0104804 | 9/2016 | |
| KR | 10-1980231 | 5/2019 | |
| WO | WO-2020004730 A1 * | 1/2020 | H01L 27/3211 |

* cited by examiner

*Primary Examiner* — Shaun M Campbell
(74) *Attorney, Agent, or Firm* — F. Chau & Associates, LLC

(57) ABSTRACT

A display panel includes a light emitting element layer comprising a pixel definition layer having an opening defined therethrough and a light emitting element disposed in the opening. The pixel definition layer includes a first barrier portion and a second barrier portion spaced apart from each other in a first direction to define a first space having a first length in the first direction. A first inorganic layer covers the light emitting element layer. The first inorganic layer includes an uneven upper surface corresponding to the first space. An organic layer is in contact with an upper surface of the first in layer. A first groove is defined by the upper surface of the first inorganic layer overlapping the first space. A thickness of the first inorganic layer overlapping the first space varies. The organic layer is filled in the first groove.

20 Claims, 13 Drawing Sheets

DISPLAY PANEL

CROSS-REFERENCE TO RELATED APPLICATION

This application claims priority under 35 U.S.C. § 119 to Korean Patent Application No. 10-2020-0105897, filed on Aug. 24, 2020 in the Korean Intellectual Property office, the disclosure of which is incorporated by reference in its entirety herein.

1. TECHNICAL FIELD

The present inventive concepts relate to a display panel. More particularly, the present inventive concepts relate to a display panel having increased reliability.

2. DISCUSSION OF RELATED ART

Various multimedia electronic devices include display devices to provide images to users, such as television sets, mobile phones, tablet computers, a notebook computer, a game unit, etc. Various flexible display devices, such as rollable display devices, foldable display devices, etc., are being developed for increased user convenience and portability.

The display device includes a display panel, such as a liquid crystal display panel, an organic light emitting diode display panel, a micro-light-emitting-diode display panel, or the like.

However, delamination defects occur between stacked components of the display panel due to the bending of the display panel in rollable or foldable display devices. Accordingly, research to reduce or prevent delamination defects of the stacked components is on-going.

SUMMARY

The present inventive concepts provide a display panel that reduces or prevents delamination detects between stacked components thereof and has increased reliability.

According to an embodiment of the present inventive concepts, a display panel includes a light emitting element layer comprising a pixel definition layer having an opening defined therethrough and a light emitting element disposed in the opening. The pixel definition layer includes a first barrier portion and a second barrier portion spaced apart from each other in a first direction to define a first space having a first length in the first direction. A first inorganic layer covers the light emitting element layer. The first inorganic layer includes an uneven upper surface corresponding to the first space. An organic layer is in contact with an upper surface of the first inorganic layer. A first groove is defined by the upper surface of the first inorganic layer overlapping the first space. A thickness of the first inorganic layer overlapping the first space varies. The organic layer is filled in the first groove.

In an embodiment, the first inorganic layer overlapping the first space includes a first portion disposed to be substantially parallel to the light emitting element layer, a second portion bent from the first portion, and a third portion bent from the first portion, spaced apart from the second portion, and facing the second portion. An upper portion of each of the second portion and the third portion has a thickness greater than a thickness of a lower portion of each of the second portion and the third portion.

In an embodiment, a width of an upper portion of the first groove is smaller than a width of a lower portion of the first groove.

In an embodiment, the display panel further includes a third barrier portion that defines a second space with a second length together with the first barrier portion in a second direction crossing the first direction, and the second length is greater than the first length.

In an embodiment, a second groove is defined by the upper surface of the first inorganic layer overlapping the second space, and a width of an upper portion of the second groove is greater than a width of an upper portion of the first groove.

In an embodiment, the first space and the second space are provided integrally with each other.

In an embodiment, the width of the upper portion of the second groove is equal to or greater than a width of a lower portion of the second groove.

In an embodiment, the first groove and the second groove are provided integrally with each other.

In an embodiment, each of the first and second barrier portions has a triangular shape, a quadrangular shape, or a fan shape in a plane.

In an embodiment, the first barrier portion includes a lower surface and a first lateral surface, the second barrier portion includes a lower surface and a second lateral surface facing the first lateral surface. Each of an angle between the lower surface and the first lateral surface of the first barrier portion and an angle between the lower surface and the second lateral surface of the second barrier portion is equal to or greater than about 45 degrees and smaller than about 180 degrees.

In an embodiment, the first lateral surface is parallel to the second lateral surface.

In an embodiment, the pixel definition layer further includes a base portion in contact with the lower surface of each of the first barrier portion and the second barrier portion and is provided with the opening defined therethrough.

In an embodiment, the first and second barrier portions are provided integrally with the base portion.

In an embodiment, each of the first barrier portion and the second barrier portion is provided in plural, and the plurality of the first and second barrier portions have a pattern shape in a plane.

In an embodiment, the first space and the second space have a radial shape with respect to an imaginary center in a plane.

In art embodiment, the light emitting element includes a first electrode whose at least a portion is exposed through the opening, a light emitting, layer disposed on the first electrode, and a second electrode disposed on the light emitting layer, and the second electrode is disposed on the pixel definition layer to correspond to a shape of an upper surface of the pixel definition layer.

In an embodiment, the light emitting element further includes a hole control layer disposed between the first electrode and the light emitting layer and an electron control layer disposed between the light emitting layer and the second electrode.

In an embodiment, the display panel further includes a second inorganic layer disposed on the organic layer.

In an embodiment, the display panel further includes a foldable base layer disposed under the light emitting element layer.

According to an embodiment of the present inventive concepts, a display panel includes a light emitting element layer comprising a pixel definition layer having an opening defined therethrough and a light emitting element disposed in the opening. The pixel definition layer comprises a plurality of barrier portions that are spaced apart from each other to form a predetermined space. A first inorganic layer covers the light emitting element layer and is disposed to correspond to the predetermined space. An organic layer is in direct contact with an upper surface of the first inorganic layer. A second inorganic layer is disposed on the organic layer. The plurality of barrier portions comprises a first barrier portion and a second barrier portion spaced apart from the first barrier portion. The first barrier portion includes a first lateral surface and the second barrier portion includes a second lateral surface that faces the first lateral surface. The first inorganic layer disposed on the first lateral surface of the first barrier portion and the second lateral surface of the second barrier portion has a thickness at an upper portion thereof that is greater than a thickness at a lower portion thereof.

According to an embodiment of the present inventive concepts, a display panel includes a light emitting, element layer comprising a pixel definition layer having an opening defined therethrough and a light emitting element disposed in the opening. The pixel definition layer comprises a plurality of barrier portions that are spaced apart from each other to form a predetermined space. Adjacent barrier portions of the plurality of barrier portions form a plurality of barrier groups. A first inorganic layer covers the light emitting element layer and is disposed to correspond to the predetermined space. Each of the plurality of barrier groups includes at least one first groove defined by the upper surface of the first inorganic layer overlapping the predetermined space. The at least one first groove has an upper surface having a smaller width than a width of a lower surface of the at least one first groove. An organic layer is in direct contact with an upper surface of the first inorganic layer and fills the at least one first groove.

According to the above, the delamination defects occurring between the stacked components of the display panel due to the repeated folding and unfolding operations may be reduced or prevented.

BRIEF DESCRIPTION OF THE DRAWINGS

The above and other advantages of the present inventive concepts will become readily apparent by reference to the following detailed description when considered in conjunction with the accompanying drawings wherein.

DETAILED DESCRIPTION OF EMBODIMENTS

Figure 1A:
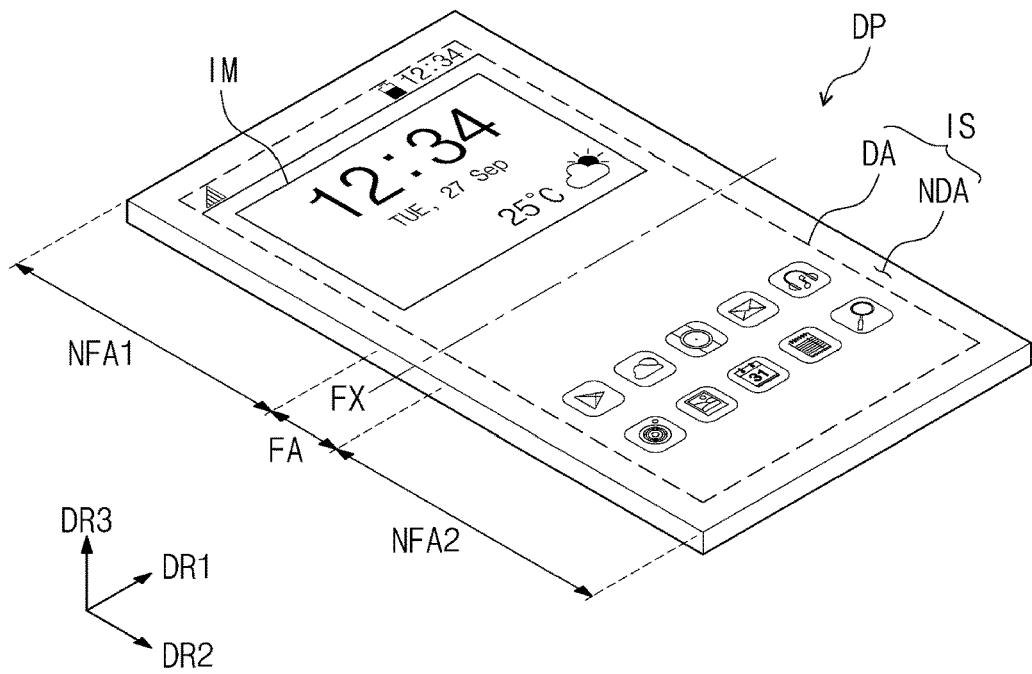
FIG. 1A is a perspective view showing a display panel according to an embodiment of the present inventive concepts.

In the present inventive concepts, it will be understood that, when an element or layer is referred to as being "on", "connected to" or "coupled to" another element or layer, it can be directly on, connected or coupled to the other element or layer or intervening elements or layers may be present. When an element or layer is referred to as being "directly on", "directly connected to" or "directly coupled to" another element or layer, no intervening elements may be present.

Like numerals refer to like elements throughout. In the drawings, the thickness, ratio, and dimension of components may be exaggerated for effective description of the present inventive concepts. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and or groups thereof.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present inventive concepts will be explained in detail with reference to the accompanying drawings.

Figure 1B:
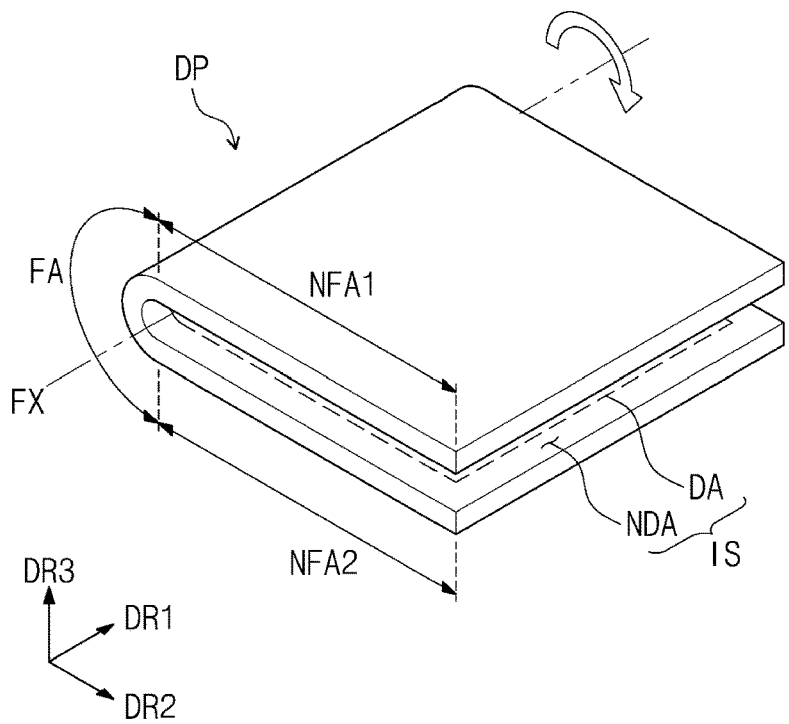
FIG. 1B is a perspective view showing the display panel shown in FIG. 1A in a folded state according to an embodiment of the present inventive concepts.
Figure 1C:
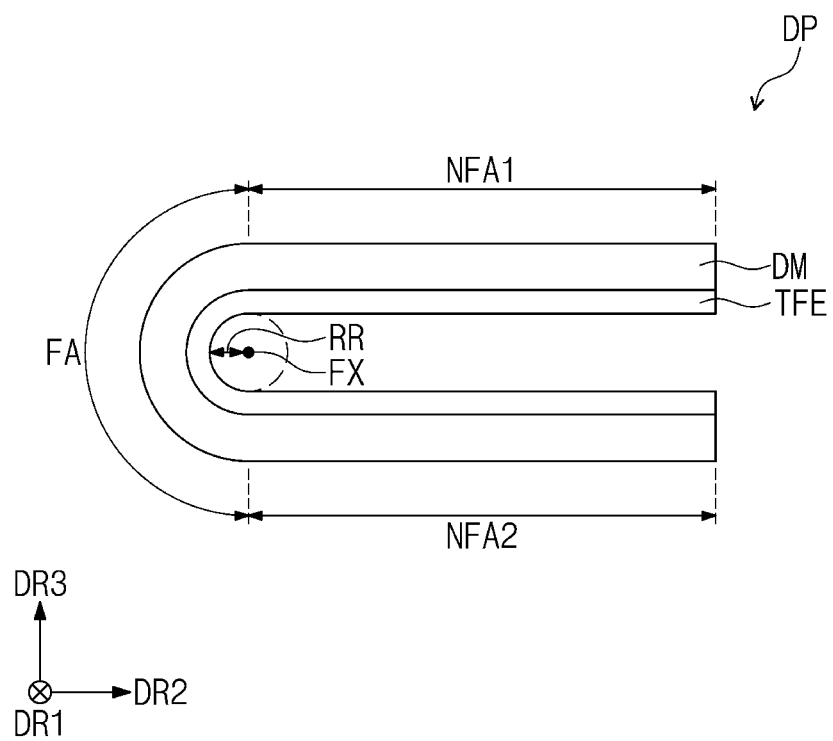
FIG. 1C is a cross-sectional view showing the display panel shown in FIG. 1B in the folded state according to an embodiment of the present inventive concepts.

FIG. 1A is a perspective view showing a display panel DP according to an embodiment of the present inventive concepts. FIG. 1B is a perspective view showing the display panel DP shown in FIG. 1A in a folded state. FIG. 1C is a cross-sectional view showing the display panel DP shown in FIG. 1B in the folded state.

The display panel DP according to an embodiment of the present inventive concepts may be a device that is activated in response to electrical signals to display an image. In an embodiment, the display panel DP may be applied to various electronic devices, such as a mobile phone, a notebook computer, a tablet computer, a navigation unit, a game unit, or a television set. However, embodiments of the present inventive concepts are not limited thereto and the display panel DP may be applied to other small, medium and large sized electronic devices.

Referring to the embodiment FIG. 1A, the display panel DP may have a rectangular shape with relatively shorter sides in a first direction DR1 and relatively longer sides in a second direction DR2 crossing the first direction DR1. An upper surface of the display panel DP may be defined as a display surface IS. The display surface IS may extend in a plane defined by the first direction DR1 and the second direction DR2. However, embodiments of the present inventive concepts are not limited thereto and the shape of the display panel DP may have a variety of shapes and the display surface IS may extend on one or more planes extending in a variety of different directions.

The display surface IS may include a display area DA and a non-display area NDA adjacent to the display area DA. The display area DA may be an area in which an image IM is displayed, and the non-display area NDA may be an area in which the image IM is not displayed. In an embodiment, the image IM may be at least one moving and/or still images. In the embodiment of FIG. 1A, the image IM is software application icons and a clock, temperature and calendar window. However embodiments of the present inventive concepts are not limited thereto and the image IM may be various different subject matter.

As shown in the embodiment of FIG. 1A, the display area DA may have a rectangular shape. The non-display area NDA may surround the display area DA. For example, as shown in the embodiment of FIG. 1A, the non-display area NDA may completely surround the display area DA (e.g., in the first and second directions DR1, DR2). However, embodiments of the present inventive concepts are not limited thereto. For example, the shape of the display area DA and the shape of the non-display area NDA may have various different shapes. Additionally, the non-display area NDA may not surround one or more sides of the display area DA. For example, the non-display area NDA may be adjacent to only one side of the display area DA or may be omitted.

Meanwhile, upper (or front) and lower (or rear) surfaces of each member are defined with respect to a direction in which the image IM is displayed. The front and rear surfaces are opposite to each other in a third direction DR3, and a normal line direction of each of the font and lower surfaces may be substantially parallel to the third direction DR3.

Directions indicated by the first, second, and third directions DR1, DR2, and DR3 may be relative to each other and may be changed to other directions. Hereinafter, the first, second, and third directions respectively are assigned with the same reference numerals as those of the first, second, and third directions DR1, DR2, and DR3.

The display panel DP of the present inventive concepts may be flexible. For example, the display panel DP may have a flexible property, and the display panel DP may be fully bent or may be bent in the scale of a few nanometers. For example, the display panel DP may be a curved display panel or a foldable display panel. However, embodiments of the present inventive concepts are not limited thereto. For example, in an embodiment, the display panel DP may be rigid.

As shown in the embodiments of FIGS. 1A to 1C, the display panel DP according to an embodiment may be folded or unfolded about a folding axis FX extending in one direction. The display panel DP may be inwardly folded (in-folding) or outwardly folded (out-folding) about the folding axis FX. The embodiment of FIG. 1A shows the unfolded display panel DP, and the embodiments of FIGS. 1B and 1C show the inwardly folded (in-folding) display panel DP.

In an embodiment, the folding axis FX may extend along one direction of the display panel DP. For example, the folding axis FX may correspond to an axis substantially parallel to the relatively shorter sides of the display panel DP (e.g. the first direction DR1) as shown in the embodiments of FIGS. 1A to 1C. However, embodiments of the present inventive concepts are not limited thereto or thereby, and the folding axis may correspond to an axis substantially parallel to the relatively longer sides of the display panel DP (e.g., the second direction DR2), may extend along a diagonal line between the first and the second directions DR1, DR2, etc.

The display panel DP may include a folding area FA in which a change in shape occurs with respect to the folding axis FX and first and second non-folding areas NFA1 and NFA2 respectively adjacent to both ends of the folding area FA such that the folding area FA is disposed between the first and second non-folding areas NFA1 and NFA2. Referring to the embodiment of FIG. 1A, the display panel DP may include a first non-folding area NFA1 adjacent to one side of die folding area FA (e.g., in the second direction DR2), which is substantially parallel to the folding axis FX, and a second non-folding area NFA2 adjacent to the other side of the folding area FA (e.g., in the second direction DR2), which is substantially parallel to the folding axis FX. The embodiments of FIGS. 1A to 1C show one folding area FA. However, embodiments of the present inventive concepts are not limited thereto and the display panel DP may include a plurality of folding areas defined therein.

Referring to the embodiment of FIG. 1B, the display panel DP may be inwardly folded (in-folding) about the folding axis FX. When the display panel DP is inwardly folded (in-folding), the display surface IS of the first non-folding area NFA1 and the display surface IS of the second non-folding area NFA2 face each other. Accordingly, a rear surface of the display panel DP, which is opposite to the display surface IS of the display panel DP, may be exposed to the outside, and the display surface IS of the display panel DP may be protected from external impacts.

Meanwhile, the display panel DP may be outwardly folded (out-folding) about the folding axis FA. When the display panel DP is outwardly folded, the display surface IS of the first non-folding area NFA1, the second non-folding area NFA2, and the folding area FA may be exposed to the outside. The image IM may be displayed through the display surface IS exposed to the outside of the display panel DP that is outwardly folded.

Referring to the embodiment of FIG. 1, the display panel DP may include a display module DM and an encapsulation layer TFE. The encapsulation layer TFE may be disposed on the display module DM. The encapsulation layer TFE may cover the display module DM.

FIG. 1C shows a cross-section of the inwardly folded display panel DP, and an upper surface of the display module DM and the encapsulation layer TFE may face each other in the third direction DR3. The folded display panel DP may have a predetermined radius of curvature RR with respect to the folding axis FX. A stress applied to the folding area FA may vary depending on a value of the radius of curvature RR, and a delamination defect may occur between interfaces of each component of the display panel DP due to the stress.

According to the display panel DP of the present inventive concepts, the delamination defect between the display module DM and the encapsulation layer TFE covering the display module DM may be reduced or prevented. Accordingly, although the folding and unfolding operations are repeatedly performed, the display module DM and the encapsulation layer TFE are not easily separated from each other, and a reliability of the display panel DP may be increased. The display module DM and the encapsulation layer TFE will be described in detail later.

Figure 2:
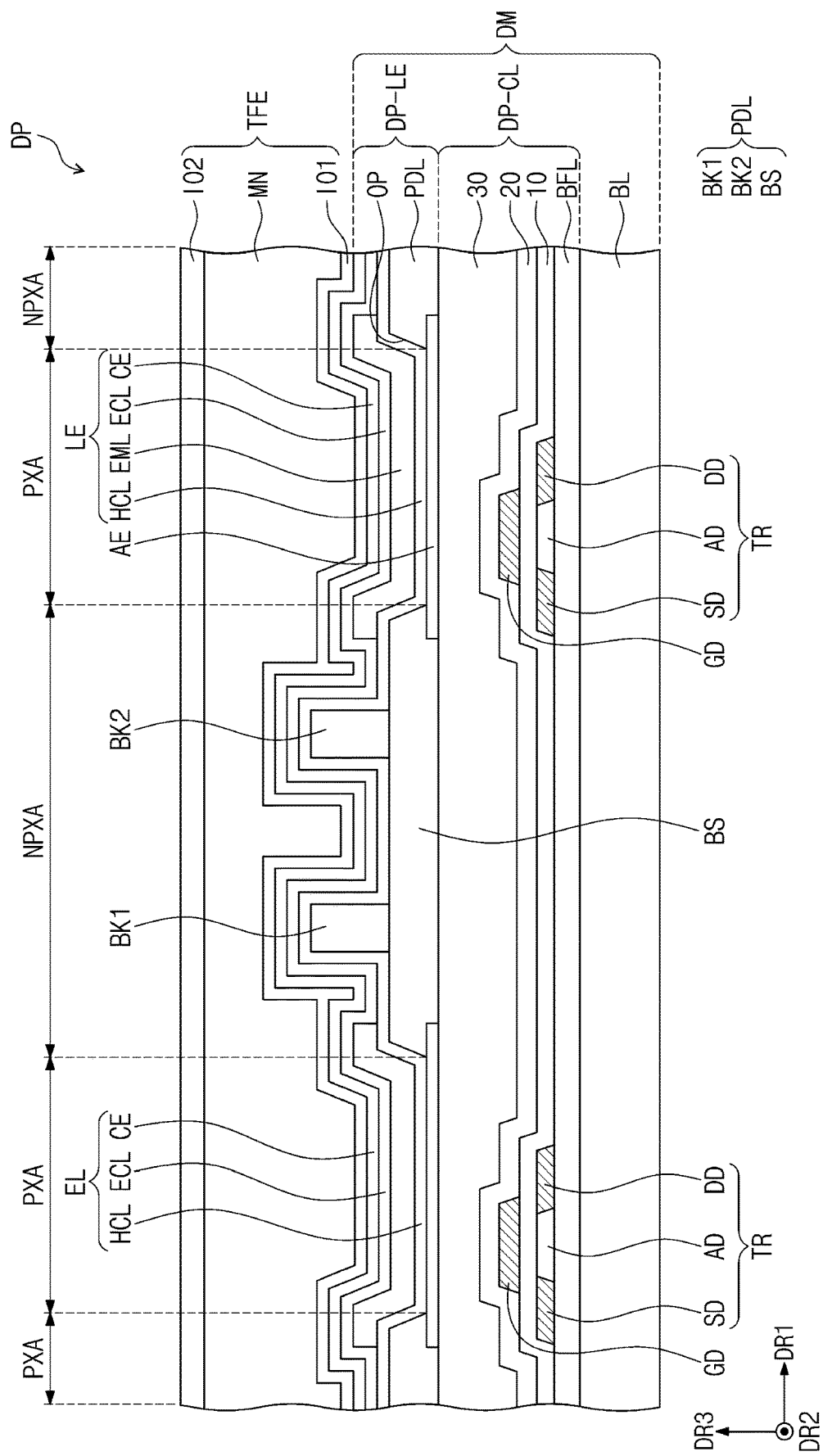
FIG. 2 is a cross-sectional view showing a display panel according to an embodiment of the present inventive concepts.

FIG. 2 is a cross-sectional view showing the display panel DP according to an embodiment of the present inventive concepts. In an embodiment, the display panel DP may be a light emitting type display panel. For example, the display panel DP may be a liquid crystal display panel, an organic electroluminescence display panel, or a quantum dot light emitting display panel. However, embodiments of the present inventive concepts are not limited thereto. Hereinafter, for convenience of explanation, the display panel DP will be described as an organic electroluminescence display panel.

As shown in the embodiment of FIG. 2, the display panel DP may include a base layer BL, a circuit layer DP-CL, a light emitting element layer DP-LE, and the encapsulation layer TFE, which are sequentially stacked in the third direction DR3. The display panel DP may include a plurality of light emitting areas PXA that emit a light and a peripheral area NPXA surrounding the light emitting areas PXA.

In an embodiment, the base layer BL may be a flexible substrate and may be folded and unfolded. In an embodiment, the base layer BL may include a synthetic resin substrate. The synthetic resin substrate may include at least one material selected from a polyimide-based resin, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. However, embodiments of the present inventive concepts are not limited thereto or thereby. In an embodiment, the base layer BL may include a glass substrate, a metal substrate, or an organic/inorganic composite material, and the base layer BL may be rigid.

The circuit layer DP-CL may be disposed on the base layer BL (e.g., directly thereon in the third direction DR3).

In an embodiment, the circuit layer DP-CSL may include at least one insulating layer and a circuit element. The circuit element may include a signal line and a pixel driving circuit. In an embodiment, the circuit layer DP-CL may be formed by a coating or depositing process to form at insulating layer, a semiconductor layer, and a conductive layer and several photolithography processes to pattern the insulating layer, the semiconductor layer, and the conductive layer. However, embodiments of the present inventive concepts are not limited thereto.

As shown in the embodiment of FIG. 2, the circuit layer DP-CL may include a buffer layer BFL, a plurality of insulating layers, such as first to third insulating layers 10, 20, and 30, and a plurality of transistors TR. The embodiment of FIG. 2 shows two transistors TR. However, embodiments of the present inventive concepts are not limited thereto and the number of the transistors TR may vary.

The buffer layer BFL may be disposed on the base layer BL (e.g., directly thereon in the third direction DR3). The buffer layer BFL may be formed on an upper surface of the base layer BL. The buffer BFL layer may include at least one inorganic layer. Its an embodiment, the inorganic layer may include at least one compound selected from aluminum oxide, titanium oxide, silicon oxide, silicon oxynitride, zirconium oxide, and hafnium oxide. The buffer layer BFL may have a multi-layer structure in which a silicon oxide layer and a silicon nitride layer are alternately stacked one on another. However, embodiments of the present inventive concepts are not limited thereto and the material for the buffer layer BFL may vary.

A semiconductor pattern may be disposed on the buffer layer BFL (e.g., directly thereon in the third direction DR3). The buffer layer BFL may increase an adhesion between the base layer BL and the semiconductor pattern. In an embodiment, the semiconductor pattern may include polysilicon, amorphous silicon or metal oxide. However, embodiments of the present inventive concepts are not limited thereto.

FIG. 2 shows an arrangement of an active AD, a source SD, a drain DD, and a gate GD that form the transistor TR. The active AD, the source SD, and the drain DD may be distinct from each other by a doping concentration or a conductivity of the semiconductor pattern.

A first insulating layer 10 may be disposed on the buffer layer BFL (e.g., directly thereon in the third direction DR3). The first insulating layer 10 may cover the semiconductor pattern. In an embodiment, the first insulating layer 10 may be an inorganic layer and/or an organic layer and may have a single-layer or multi-layer structure.

The gate GD may be disposed on the first insulating layer 10 (e.g., directly thereon in the third direction DR3). In an embodiment, the gate GD may be a portion of a metal pattern. The gate GD may overlap the active AD (e.g., in the third direction DR3).

A second insulating layer 20 may be disposed on the first insulating layer 10 (e.g., directly thereon in the third direction DR3) and may cover the gate GD. In an embodiment, the second insulating layer 20 may be an inorganic layer and/or an organic layer and may have a single-layer or multi-layer structure.

A third insulating layer 30 may be disposed on the second insulating layer 20 (e.g., directly thereon in the third direction DR3). In an embodiment, the third insulating layer 30 may be an inorganic layer and/or an organic layer and may have a single-layer structure of a silicon oxide layer.

In an embodiment, each of the first insulating layer 10, the second insulating layer 20, and the third insulating layer 30 may include at least one compound selected from aluminum oxide, titanium oxide, silicon oxide, silicon oxynitride, zirconium oxide, and hafnium oxide. However, embodiments of the present inventive concepts are not limited thereto and the materials for the first insulating layer 10, the second insulating layer 20, and the third insulating layer 30 may vary.

The light emitting element layer DP-LE may be disposed on the circuit layer DP-CL (e.g., directly thereon in the third direction DR3). The light emitting element layer DP-LE may include a light emitting element LE and a pixel definition layer PDL. The pixel definition layer PDL may be include an opening OP defined therethrough, and the light emitting element LE may be disposed to overlap the opening OP. The light emitting element LE may be disposed in the opening OP.

The light emitting element LE may include a first electrode AE, a second electrode CE, and a light emitting layer EML disposed between the first and second electrodes AE and CE (e.g., in the third direction DR3). The light emitting element LE may further include functional layers disposed between the light emitting layer EML and each of the first electrode AE and the second electrode CE. For example, in the embodiment of FIG. 2, the light emitting element LE may include the first electrode AE, the second electrode CE, the light emitting layer EML, a hole control layer HCL, and an electron control layer ECL. However, embodiments of the present inventive concepts are not limited thereto and the functional layers included in the light emitting element LE may vary.

The first electrode AE may be disposed on the third insulating layer 30 (e.g., directly is thereon in the third direction DR3). The first electrode AE may be connected directly or indirectly to the transistor TR. At least a partial portion of the first electrode AE may be exposed through the opening OP defined through the pixel definition layer PDL. For example, as shown in the embodiment of FIG. 2, a central portion of the first electrode AE (e.g., in the first direction DR1) may be exposed by the opening OP.

The light emitting layer EML may be disposed between the first electrode AE and the second electrode CE (e.g., in the third direction DR3). In an embodiment, the light emitting layer EML may be activated according to a difference in electric potential between the first electrode AE and the second electrode CE and may generate a light. The light generated by the light emitting layer EML may exit through the upper surface of the display panel DP. For example, the generated light may be a blue light. However, embodiments of the present inventive concepts are not limited thereto.

As shown in the embodiment of FIG. 2, the light emitting element LE may include the hole control layer HCL disposed between the first electrode AE and the light emitting layer EML (e.g., in the third direction DR3) and the electron control layer ECL disposed between the second electrode CE and the light emitting layer EML (e.g., in the third direction DR3). The hole control layer HCL may include at least one of a hole transport layer and a hole injection layer. The electron control layer ECL may include at least one of an electron transport layer and an electron injection layer.

The pixel definition layer PDL may be disposed on the circuit layer DP-CL. The pixel definition layer PDL may be disposed on the third, insulating layer 30 included its the circuit layer DP-CL. For example, as shown in the embodiment of FIG. 2, a lower portion of the pixel definition layer PDL may directly contact an upper surface of third insulation layer 30 and lateral ends of the first electrode AE. In an embodiment, the opening OP defined through the pixel definition layer PDL may be provided in plural, and the openings OP may respectively overlap the light emitting areas PXA (e.g., in the third direction DR3). The pixel definition layer PDL may be disposed to overlap the peripheral area NPXA (e.g., in the third direction DR3). In an embodiment, the pixel definition layer PDL may include an organic layer.

The pixel definition layer PDL may include a base portion BS and a plurality of barrier portions, such as first and second barrier portions BK1 and BK2. A lower surface of first and second barrier portions BK1 and BK2 may be in direct contact with the base portion BS. The first and second barrier portions BK1 and BK2 may be spaced apart from each other (e.g., in the first direction DR1) to form a space. However, embodiments of the present inventive concepts are not limited thereto and the configuration of the pixel definition layer PDL may vary. For example, in an embodiment the base portion BS included in the pixel definition layer PDL may be omitted.

The light emitting later EML may be commonly disposed or may be independently disposed in the light emitting areas PXA. The expression "independently disposed" means that the light emitting layer EML is divided into discrete, plural portions and the portions are respectively disposed in the light emitting areas PXA to be separated from each other as shown in the embodiment of FIG. 2. The expression "commonly disposed" means that the light emitting layer EML is disposed commonly in the light emitting areas PXA and the peripheral area NPXA and is not disposed separately.

As shown in the embodiment of FIG. 2, the hole control layer HCL, the electron control layer ECL, and the second electrode CE be commonly disposed in the light emitting areas PXA and the peripheral area NPXA. The hole control layer HCL, the electron control layer ECL, and the second electrode CE, which are commonly disposed, may be defined as a common layer EL. The common layer EL may be disposed on the pixel definition layer PDL, and the common layer EL may be formed to correspond to an uneven upper surface of the pixel definition layer PDL. For example, as shown in the embodiment of FIG. 2, the hole control layer HCL, the electron control layer ECL, and the second electrode CE may correspond to a shape of the uneven upper surface of the pixel definition layer PDL. However, embodiments of the present inventive concepts are not limited thereto and the elements of the comm on layer EL may vary.

The encapsulation layer TFE may be disposed on the light emitting element layer DP-LE (e.g., directly thereon in the third direction DR3). The encapsulation layer TFE may encapsulate the light emitting element layer DP-LE. The encapsulation layer TFE may include at least one insulating layer. In an embodiment, the encapsulation layer TFE may include at least one organic layer and at least one inorganic layer. For example, as shown in the embodiment of FIG. 2, the encapsulation layer TFE may include a first inorganic layer IO1, an organic layer MN, and a second inorganic layer IO2 sequentially stacked on the light emitting element layer DP-LE in the third direction DR3.

The first inorganic layer IO1 and the second inorganic layer IO2 may protect the light emitting element layer DP-LE from oxygen and moisture, and the organic layer MN may protect the light emitting element layer DP-LE from foreign substance such as dust particles. For example, in an embodiment, the first inorganic layer IO1 and the second inorganic layer IO2 may include a silicon nitride layer, a silicon oxynitride layer, a silicon oxide layer, a titanium oxide layer, or an aluminum oxide layer. However, embodiments of the present inventive concepts are not limited thereto. In an embodiment, the organic layer MN may include an acrylic-based organic layer. However, embodiments of the present inventive concepts are not limited thereto.

The first inorganic layer IO1 may be disposed on the common layer EL. For example, a lower surface of the first inorganic layer IO1 may be in direct contact with the common layer EL. As shown in the embodiment of FIG. 2, the first inorganic layer IO1 may be n direct contact with the second electrode CE that is commonly disposed. The organic layer MN may be disposed on the first inorganic layer IO1. For example, the organic layer MN may be directly disposed on the first inorganic layer IO1 and an upper surface of the first inorganic layer IO1 may be in direct contact with the organic layer MN.

In comparative embodiments, when a display panel is folded, a light emitting element layer and an encapsulation layer, or an inorganic layer and an organic layer of the encapsulation layer may be separated from each other due to the stress applied to a folding area (refer to FIG. 1C). However, the display panel DP of the present inventive concepts may reduce or prevent the delamination defect between the light emitting element layer DP-LE and the encapsulation layer TFE, and between the first inorganic layer IO1 and the organic layer MN of the encapsulation layer TFE.

The level of the upper surface of the pixel definition layer PDL (e.g., distance in the third direction DR3 from an upper surface of the base layer BL) may be uneven by the first and second barrier portions BK1 and BK2 and the predetermined space defined by the first and second barrier portions BK1 and BK2. The first inorganic layer IO1 may include a curved upper surface corresponding to a shape of the curved upper surface of the pixel definition layer PDL. The first inorganic layer IO1 may be deposited in various shapes by covering the first and second barrier portions BK1 and BK2 of the pixel definition layer PDL, and thus, the delamination defect between the light emitting element layer DR-LE and the encapsulation layer TFE and the delamination defect between the stacked components in the encapsulation layer TFE may be reduced or prevented.

Figure 3:
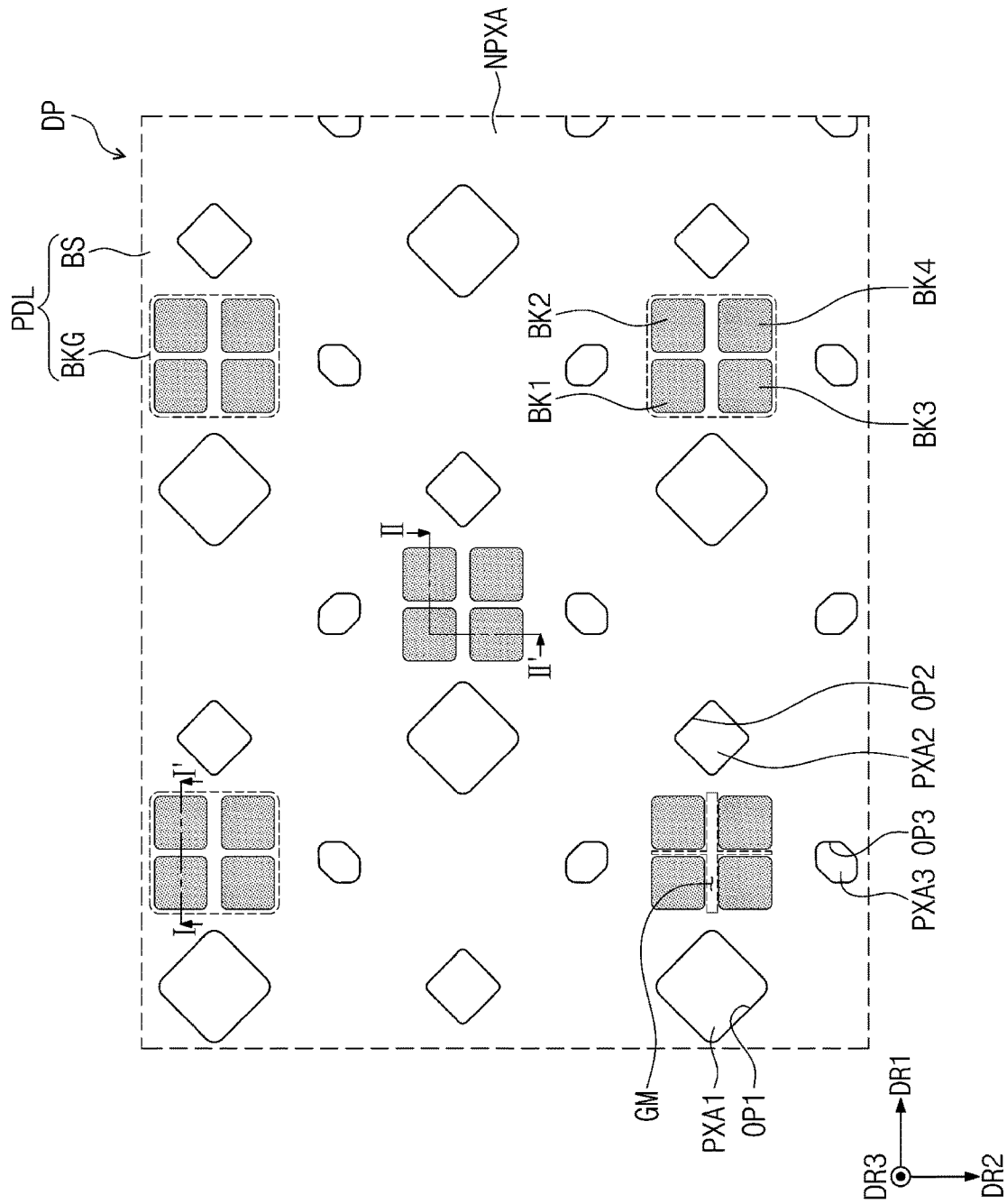
FIG. 3 is a plait view showing a display panel according to an embodiment of the present inventive concepts.

FIG. 3 is a plan view showing a display panel according to an embodiment of the present inventive concepts. For the convenience of explanation, FIG. 3 shows a plan view of the pixel definition layer PDL, and portions corresponding to first to fourth barrier portions BK1, BK2, BK3 and BK4 are shaded in the illustration. The common layer EL, the first inorganic layer IO1 and the organic layer MN are disposed on the pixel definition layer PDL shown in the embodiment of FIG. 3.

The light emitting areas PXA may be divided into a plurality of groups according to a color of a light exiting from the display panel DP. For example, as shown in the embodiment of FIG. 3, the display panel DP may include three light emitting areas, such as the first to third light emitting areas PXA1, PXA2, and PXA3, respectively emitting a blue light, a red light, and a green light. However, embodiments of the present inventive concepts are not limited thereto and the number of the light emitting areas and the colors that the light emitting areas may emit may vary. In an embodiment, the light emitting areas may include a first light emitting area PXA1 emitting the blue light, a second light emitting area PXA2 emitting the red light, and a third light emitting area PXA3 emitting the green light.

The first to third light emitting areas PXA1, PXA2, and PXA3 may be spaced apart from each other in a plane (e.g., a plane defined in the first and second directions DR1, DR2).

The first to third light emitting areas PXA1, PXA2, and PXA3 may be separated from each other by the pixel definition layer PDL. The peripheral area NPXA may be an area between the first to third light emitting areas PXA1, PXA2, and PXA3 adjacent to each other and may correspond to the pixel definition layer PDL. The peripheral area NPXA may serve as a boundary between the first to third light emitting areas PXA1, PXA2, and PXA3 and may prevent colors of lights respectively exiting from the first to third light emitting areas PXA1, PXA2, and PXA3 from being mixed with each other.

As shown in the embodiment of FIG. 3, the first to third light emitting areas PXA1, PXA2, and PXA3 may have different sizes from each other depending on a wavelength range of the light exiting therefrom. The size of the first to third light emitting areas PXA1, PXA2, and PXA3 may indicate an area in a plane defined in the first direction DR1 and the second direction DR2. However, embodiments of the present inventive concepts should not be limited thereto or thereby, and the sizes of two or more of the first to third light emitting areas PXA1, PXA2, and PXA3 may be substantially similar to each other.

In an embodiment, the first to third light emitting areas PXA1, PXA2, and PXA3 may be arranged in a pentile pattern. Referring to the embodiment of FIG. 3, the first light emitting area PXA1 and the second light emitting area PXA2 may be alternately arranged with each other in the first direction DR1 and the second direction DR2, and the third light emitting area PXA3 may be substantially disposed in an area between the first light emitting areas PXA1 and the second light emitting areas PXA2 along a diagonal direction (e.g., a direction between the first and second directions DR1, DR2 and perpendicular to the third direction DR3). However, embodiments of the present inventive concepts are not limited thereto and the arrangement of the first to third light emitting areas PXA1, PXA2, and PXA3 may vary. For example, in an embodiment, the first to third light emitting areas PXA1, PXA2, and PXA3 may be arranged in a stripe pattern or a lozenge pattern.

The pixel definition layer PDL may be provided with a plurality of openings, such as first to third openings OP1, OP2, and OP3. The first to third openings OP1, OP2, and OP3 may correspond to the shape of the first to third light emitting areas PXA1, PXA2, and PXA3 in a plane (e.g., in a plane defined in the first and second directions DR1, DR2). The pixel definition layer PDL shown in the embodiment of FIG. 3 may be provided with a first opening OP1 corresponding to the shape of the first light emitting area PXA1, a second opening OP2 corresponding to the shape of the second light emitting area PXA2, and a third opening OP3 corresponding to the shape of the third light emitting area PXA3. However, the shapes of the first to third openings OP1, OP2, OP3 should not be limited to those shown in the embodiment of FIG. 3, and the shapes of the first to third openings OP1, OP2, OP3 may vary, such as depending on the shapes of the light emitting areas.

The pixel definition layer PDL may include a plurality of barrier portions. Some barrier portions of the of the barrier portions may be disposed adjacent to each other. The embodiment of FIG. 3 shows first, second, third, and fourth barrier portions BK1, BK2, BK3, and BK4 disposed adjacent to each other (e.g., in the first and/or second directions DR1, DR2). However, the number of the barrier portions disposed adjacent to each other should not be limited thereto provided that the pixel definition layer PDL includes the barrier portions defining the predetermined space while being spaced apart from each other.

As shown in the embodiment of FIG. 3, the pixel definition layer PDL may include the first barrier portion BK1 and the second barrier portion BK2, which are spaced apart from each other by a predetermined distance in the first direction DR1 to form the space. The pixel definition layer PDL may further include the third barrier portion BK3 that is spaced apart from the first barrier portion BK1 by a predetermined distance in the second direction DR2 to form the space.

In the space defined by the barrier portions, the distance between the barrier portions may vary depending on a location thereof. For example, a distance in the first direction DR1 between the first barrier portion BK1 and the second barrier portion BK2 may be different from a distance in the second direction DR2 between the first barrier portion BK1 and the third barrier portion BK3

The first inorganic layer IO1 (refer to FIG. 4A) ma be disposed on the pixel definition layer PDL and may include an uneven upper surface corresponding to the space defined by the barrier portions. Accordingly, a groove GM may be defined by the upper surface of the first inorganic layer IO1 to overlap the space. The groove GM may have a shape corresponding to a shape of the space defined by the barrier portions when viewed in a plane.

Figure 8A:
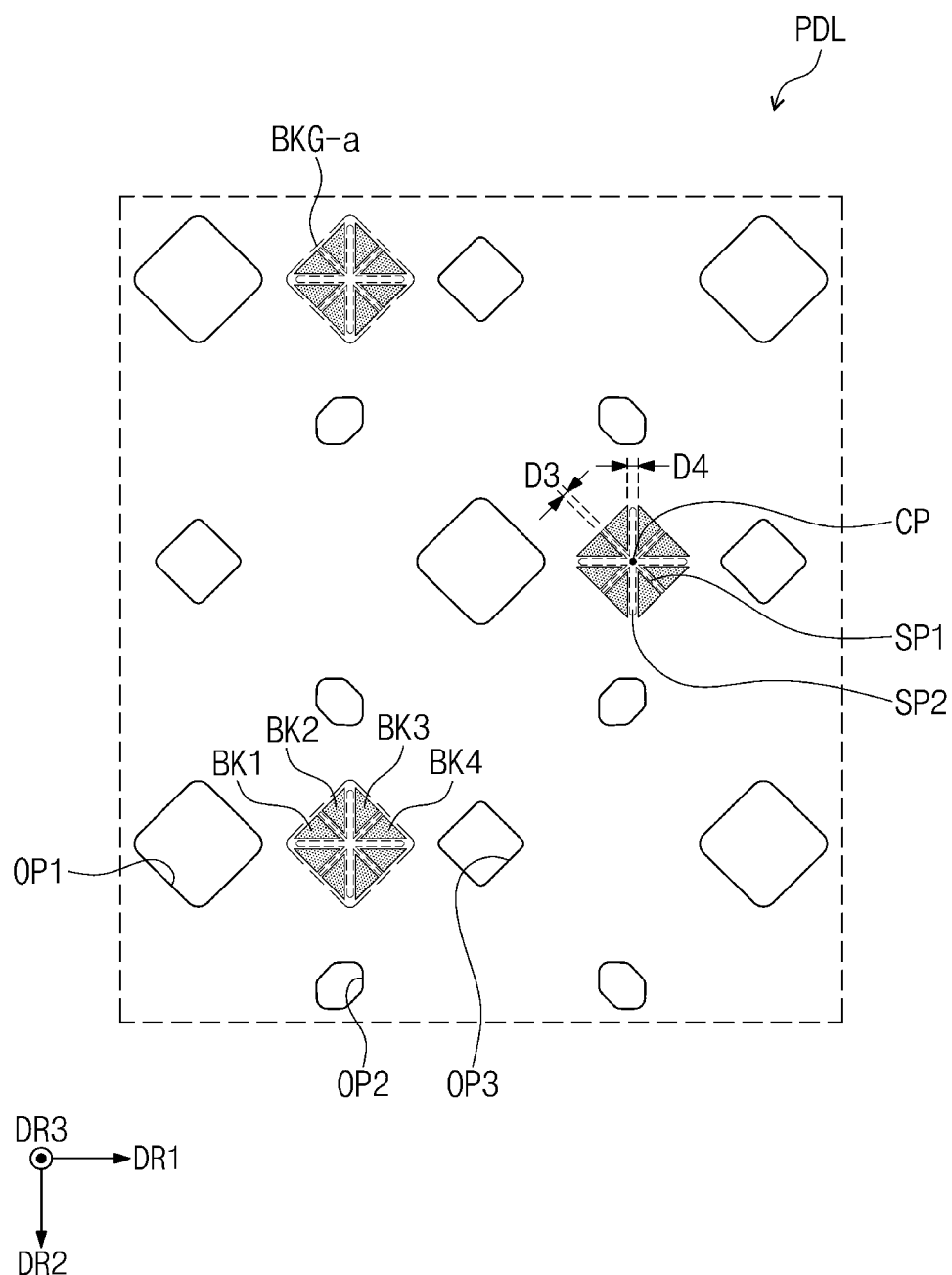
FIG. 8A is a plan view showing a pixel definition layer according to an embodiment of the present inventive concepts.
Figure 8B:
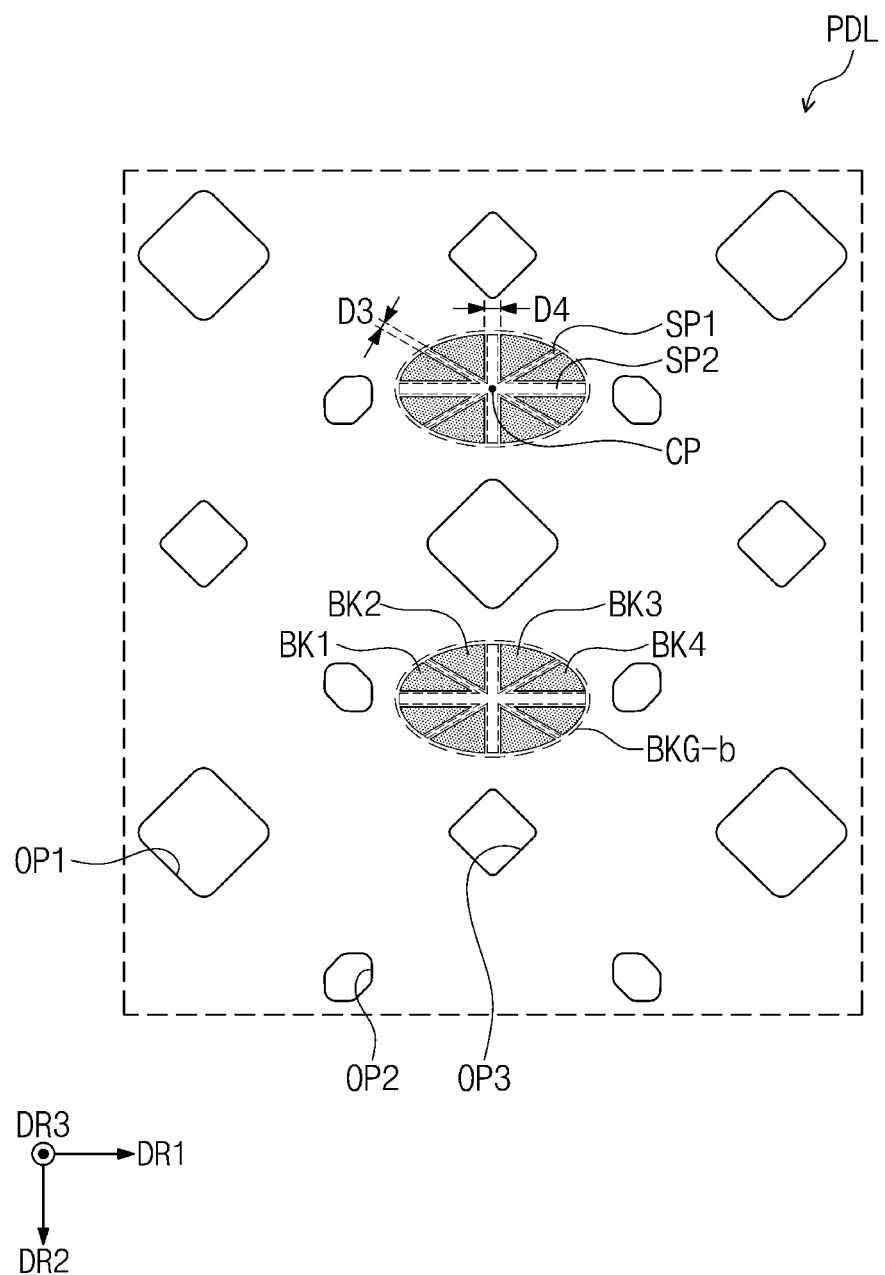
FIG. 8B is a plan view showing a pixel definition layer according to an embodiment of the present inventive concepts.
Figure 8C:
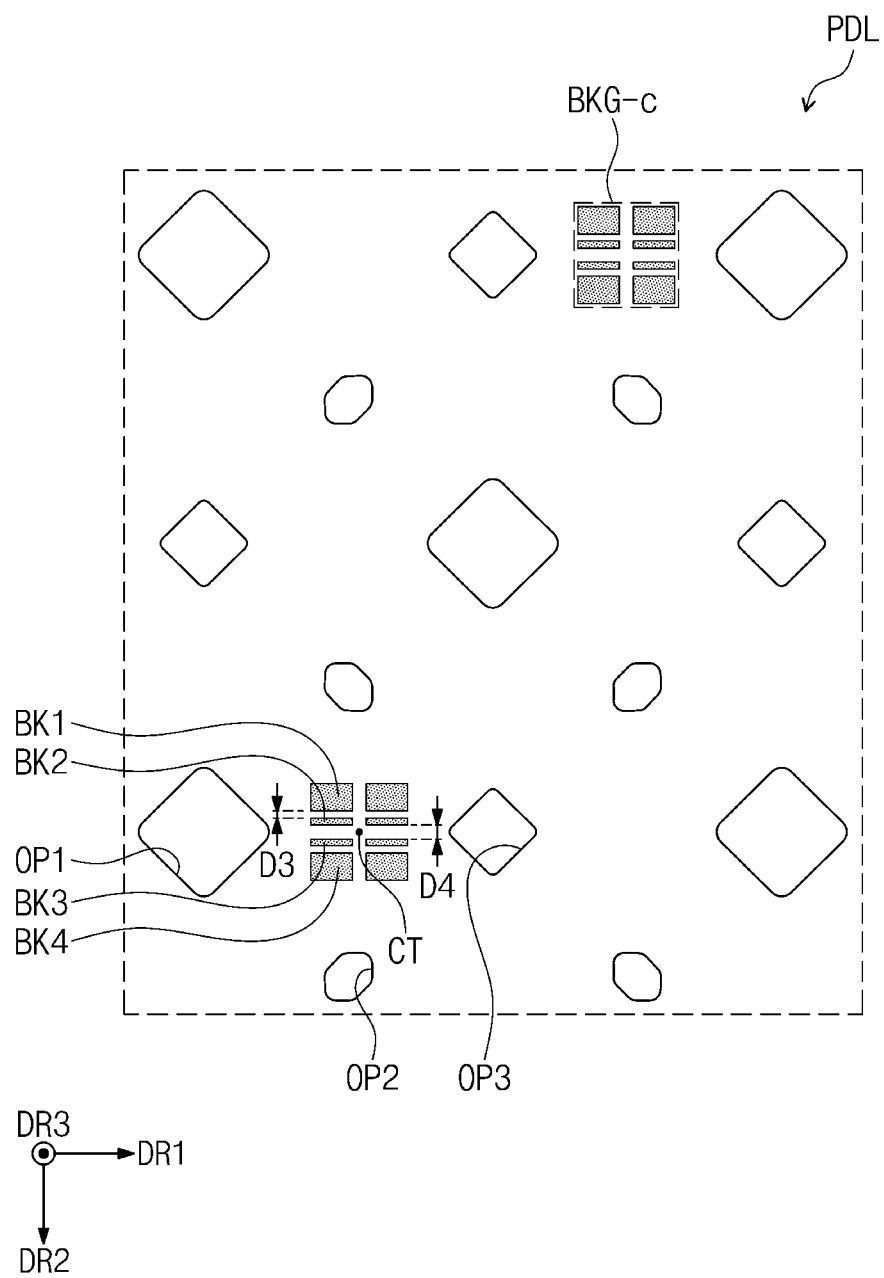
FIG. 8C is a plan view showing a pixel definition layer according to an embodiment of the present inventive concepts.

The plurality of the barrier portions disposed adjacent to each other may be defined as one barrier group BKG. For example, the embodiment of FIG. 3 includes the barrier group BKG defined by the first, second, third, and fourth barrier portions BK1, BK2, BK3, and BK4 disposed adjacent to each other. However, embodiments of the present inventive concepts are not limited thereto and the barrier group BKG may vary such as shown in the embodiments of FIGS. 8A to 8C.

A shape obtained by connecting an outer side of the barrier portions disposed adjacent to each other and the space defined by the barrier portions in a plane may vary. For example, in an embodiment, the shape may be a polygonal shape, such as a triangular shape, a quadrangular shape, a lozenge shape, and the like, or a circular shape. FIG. 3 shows the shape obtained by connecting the outer side of the barrier portions and the space defined by the barrier portions with a dotted line, and the shape may be defined as a shape of the barrier group BKG. The embodiment of FIG. 3 shows the shape of the barrier group BKG having a quadrangular shape. However, embodiments of the present inventive concepts are not limited thereto and the shape may vary as long as the shape is obtained by connecting the outer side of the harder portions defining the space.

In an embodiment, the barrier group BKG may be provided in plural, and the plurality of the barrier groups BKG may be disposed in a portion of the peripheral area NPXA to overlap the peripheral area NPXA. The barrier group BKG may be disposed not to overlap the first to third light emitting areas PXA1, PXA2, and PXA3 (e.g., in third direction DR3). As the number of the barrier groups BKG disposed on the light emitting element layer DP-LE (refer to FIG. 2) increases, a resistance of the display panel DP to external tensile force may be strengthened. In addition, the delamination defect between the common layer EL and the pixel definition layer PDL and between the common layer EL and the first inorganic layer IO1, which is caused by the folding operation, may be more effectively reduced or prevented.

Figure 4A:
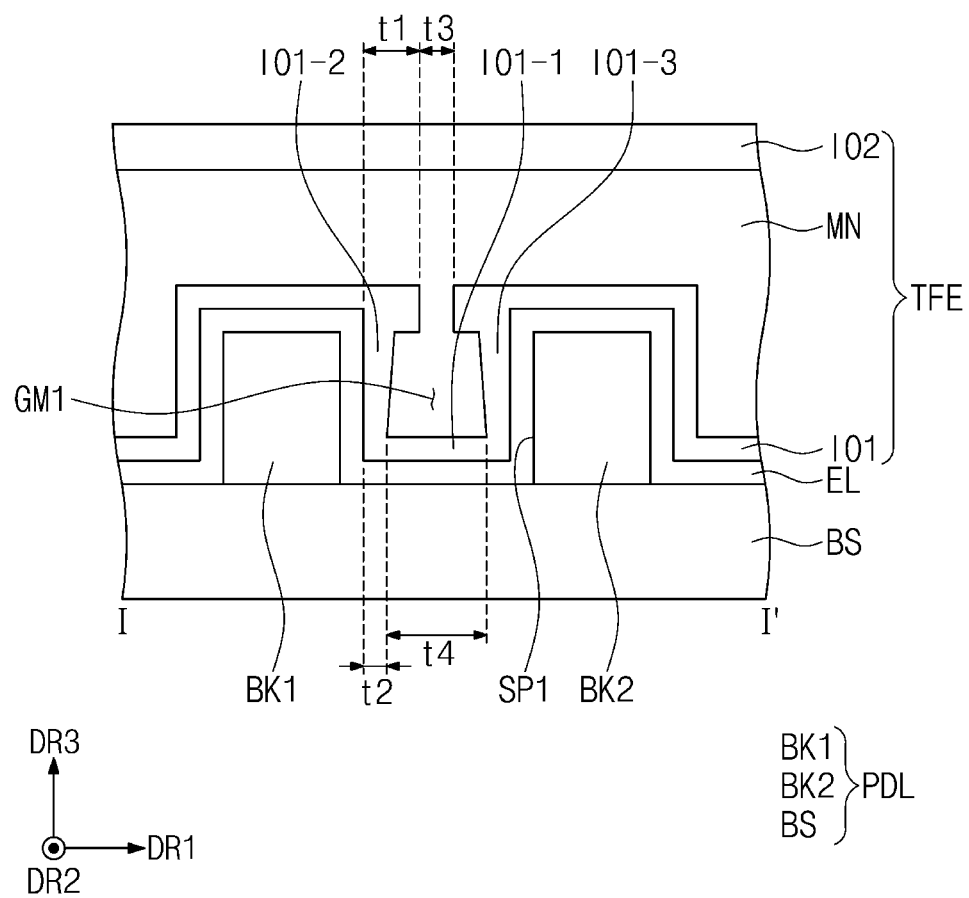
FIG. 4A is a cross-sectional view taken along line of FIG. 3 showing a portion of a display panel according to an embodiment of the present inventive concepts.
Figure 4B:
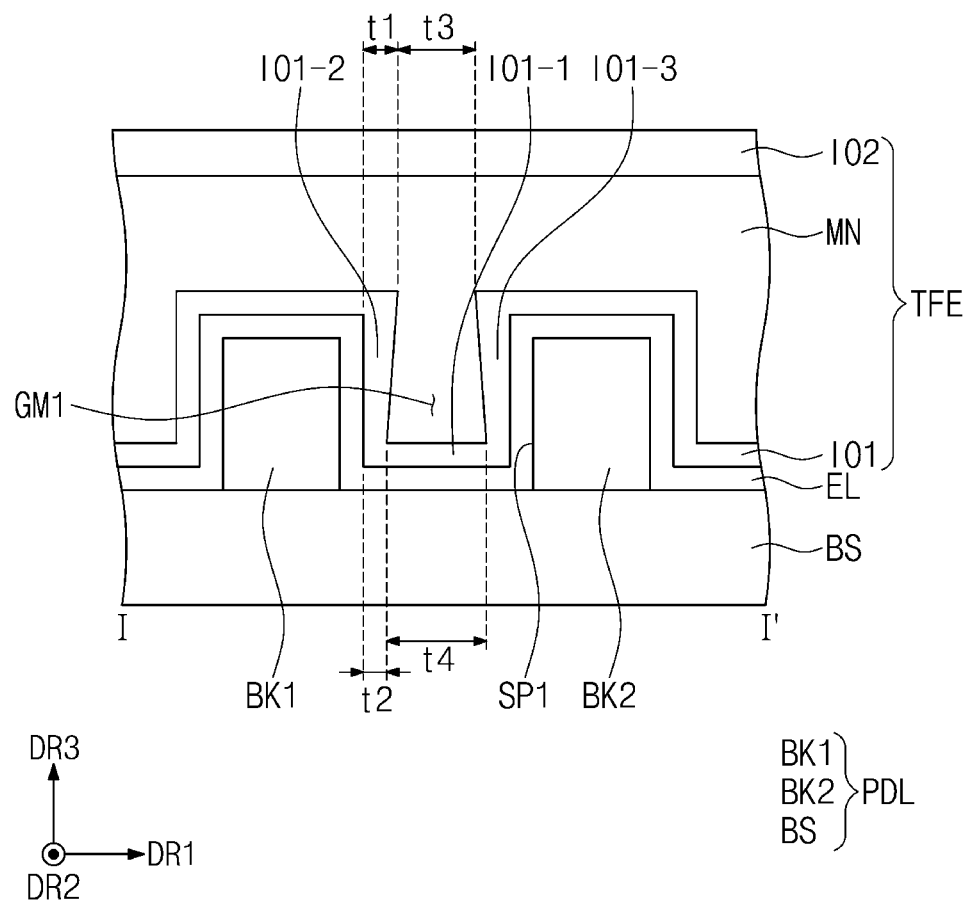
FIG. 4B is a cross-sectional view taken along line I-I' of FIG. 3 showing a portion of a display panel according to an embodiment of the present inventive concepts.

FIG. 4A is a cross-sectional view taken along line I-I' of FIG. 3 to show the pixel definition layer PDL and the encapsulation layer TFE. FIG. 4B is a cross-sectional view showing a pixel definition layer PDL and an encapsulation layer TFE, which have substantially the same configurations as those of FIG. 4A except a shape of a first inorganic layer IO1 in a side view.

Referring to the embodiment of FIG. 4A, the first barrier portion BK1 and the second barrier portion BK2, which are included in the pixel definition layer PDL, may form a first space SP1 having a first distance D1 (refer to FIG. 6) in the first direction DR1 (or a first length D1 in the first direction DR1). A first groove GM1 may be defined by the upper surface of the first int inorganic layer IO1 overlapping the first space SP1. The first inorganic layer IO1 overlapping the first space SP1 may have a thickness that varies depending on its position.

In an embodiment, the first inorganic layer IO1 may be formed on the light emitting element layer DP-LE by a chemical vapor deposition (CVD) process. The thickness of the first inorganic layer IO1 may vary due to a material of a composition forming the first inorganic layer IO1, a deposition angle, and a shape of an upper surface on which the first inorganic layer IO1 is deposited. The deposition shape of the first inorganic layer IO1 may be controlled by, adjusting the thickness of the first inorganic layer IO3 during the deposition process.

As shown in the embodiment of FIG. 4A, the first inorganic layer IO1 overlapping the first space SP1 may include first, second, and third portions IO1-1, IO1-2, and IO1-3. The first, second, and third portions IO1-1, IO1-2, and IO1-3 may be formed to correspond to the shape of the first space SP1.

As shown in the embodiment of FIG. 4A, the first portion IO1-1 of the first inorganic layer IO1 may be disposed to be substantially parallel to the light emitting element layer DP-LE. A normal line direction of an upper surface of the first portion IO1-1 may be substantially parallel to the third direction DR3. Each of the second portion IO1-2 and the third portion IO1-3 of the first inorganic layer IO1 may be bent from the first portion IO1-1. The second portion IO1-2 and the third portion IO1-3 may be spaced apart from each other in the first direction DR1 and may face each other.

As shown in the embodiment of FIG. 4A, the first groove GM1 may be defined by the upper surfaces of the first, second, and third portions IO1-1, IO1-2, and IO1-3. The first groove GM1 may be defined by being recessed from a plane. The organic layer MN may be filled in the recessed first groove GM1. As the organic layer MN is filled in the first groove GM1, the delamination reelect between the organic layer MN and the first inorganic layer IO1, which is caused by the folding operation, may be reduced or prevented.

A thickness (e.g., length in the first direction DR1) of the second portion IO1-2 and a thickness (e.g., length in the first direction DR1) of the third portion IO1-3 may vary depending on its position. For example, as shown in the embodiment of FIG. 4A, upper portions of the second portion IO1-2 and the third portion IO1-3 may be relatively thriller away from the first portion IO1-1 in the third direction DR3, and lower portions of the second portion IO1-2 and the third portion IO1-3 may be relatively closer to the first portion IO1-1 in the third direction DR3. The thickness of the upper portion of each of the second portion IO1-2 and the third portion IO1-3 may be greater than the thickness of the lower portion of each of the second portion IO1-2 and the third portion IO1-3.

As shown in the embodiment of FIG. 4A, the thickness t1 of the upper portion of the second portion IO1-2 may be greater than the thickness t2 of the lower portion of the second portion IO1-2. The shape of the first inorganic layer IO1 deposited on the pixel definition layer PDL and the common layer EL may be changed due to the different thicknesses of the upper portion and the lower portion. For example, the upper portion of the second portion IO1-2 may protrude in the first direction DR1 and may have an overhang shape that is due to the greater thickness of the upper portion of the second portion IO1-2 as compared to the lower portion of the second portion IO1-2.

As shown in the embodiment of FIG. 4A, the thickness of the second portion IO1-2 may gradually increase and the inner wall which defines a portion of the first groove GM1 may be oblique with respect to the base portion BS in a direction towards the third portion IO1-3. The upper portion of the second portion IO1-2 may protrude from an adjacent portion of the second portion IO1-2 in a non-gradual manner and may form the overhang-shaped portion. The thickness of the third portion IO1-3 may have a similar arrangement and the inner wall of the third portion IO1-3 may be oblique with respect to the base portion BS in a direction towards the second portion IO1-2.

The first groove GM1 may have a width (e.g., length in the first direction DR1) that changes depending on its position. The shape of the first groove GM1 defined by the upper surfaces of the first, second, and third portions IO1-1, IO1-2, and IO1-3 may vary due to the thickness of the first, second, and third portions IO1-1, IO1-2, and IO1-3. For example, an upper portion of the first groove GM1 may have a width t3 that is smaller than a width t4 of a lower portion of the first groove GM1.

Due to the first inorganic layer IO1 having the overhang shape in some areas, the width t3 of the upper portion of the first groove GM1 may be relatively narrower than the width t4 of the lower portion of the first groove GM1.

The organic layer MN may be in direct contact with the upper surface of the first inorganic layer IO1. In an embodiment, the organic layer MN may be formed by coating a composition forming the organic layer MN on the upper surface of the first inorganic layer IO1 and curing the composition. During the forming of the organic layer MN, the composition for the organic layer MN may be filled in the first groove GM1 and may be cured. The adhesion between the organic layer MN and the first inorganic layer IO1 may become stronger by a force of an interface between the organic layer MN filled in the first groove GM1 and the first inorganic layer IO1 and the shape of the first groove GM1 of which the width of the upper portion is relatively narrow as compared to the width of the lower portion thereof. Accordingly, the delamination defect between the organic layer MN and the first inorganic layer IO1, which is caused by the folding operation, may be reduced or prevented.

As shown in the embodiment of FIG. 4A, the first inorganic layer IO1 may be disposed in direct contact with an upper surface of the common layer EL. The first inorganic layer IO1 and the common layer EL, which are disposed to overlap the first space SP1, may be in direct contact with each other along the first direction DR1 that is a lateral direction, and thus, the first inorganic layer IO1 may apply a pressure (e.g., a pressure in the third direction DR3 towards the base portion BS) to allow the common layer EL to be fully attached to the pixel definition layer PDL. Accordingly, the delamination defect between the first inorganic layer IO1 and the common layer EL and between the common layer EL and the pixel definition layer PDL, which is caused by the folding operation, may be reduced or prevented.

The first inorganic layer IO1 shown in the embodiment of FIG. 4B has substantially the same configuration as the first inorganic layer IO1 shown in the embodiment of FIG. 4A except the shape of the first inorganic layer IO1 and the shape of the first groove GM1, which are disposed to overlap the first space SP1.

The thickness t1 (e.g., length in the first direction DR1) of the upper portion of the second portion IO1-2 of the first inorganic layer IO1 may be greater than the thickness t2 of the lower portion of the second portion IO1-2. However, different from the shape of FIG. 4A, the second portion IO1-2 and the third portion IO1-3 may have a shape in which the thickness of each of the second portion IO1-2 and the third portion IO1-3 gradually increase as a distance from the first portion IO1-1 increases along the third direction DR3 and the upper portions of the second and third portions IO1-2, IO1-3 may not protrude to form the overhang shape. Accordingly, a width t3 (e.g., length in the first direction DR1) of the upper portion of the first groove GM1 shown in FIG. 4B may be greater than the width t3 of the upper portion of the first groove GM1 shown in FIG. 4A.

As the width t3 of the upper portion of the first groove GM1 decreases, the organic layer MN filled in the first groove GM1 may not easily come out from the first groove GM1, and thus, the organic layer MN and the first inorganic layer IO1 may not be easily separated from each other in a delamination defect. The width and the shape of the first groove GM1 may be comforted by adjusting the arrangement distance between the first and second barrier portions BK1 and BK2 and the deposition process of the first inorganic layer IO1. Therefore, the organic layer MN array be sufficiently filled in the first groove GM1 and the delamination defect of the organic layer MN may be effectively reduced or prevented by controlling the width and the shape of the first groove GM1.

Figure 5A:
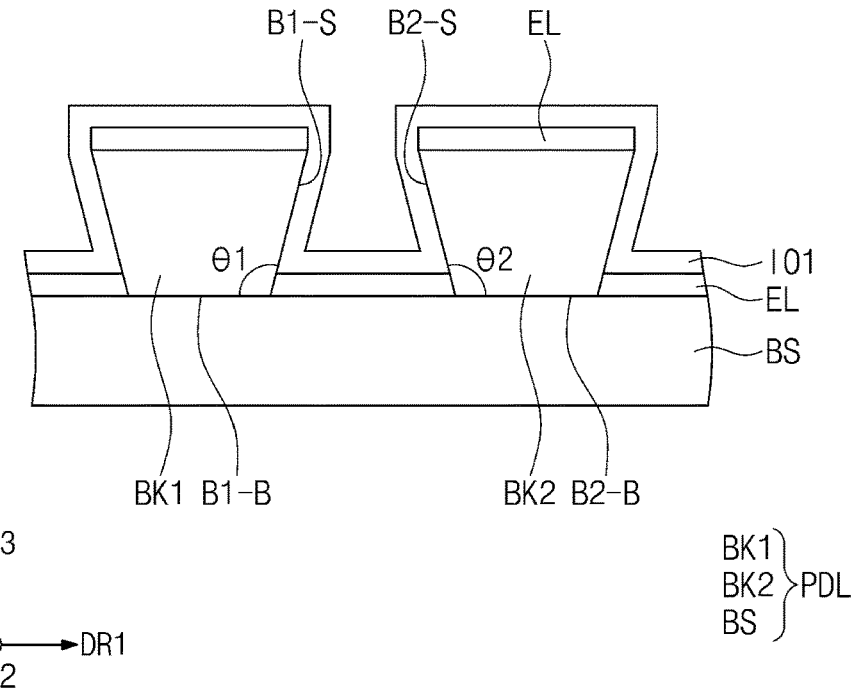
FIG. 5A is a cross-sectional view showing a portion of a display panel according to an embodiment of the present inventive concepts.
Figure 5B:
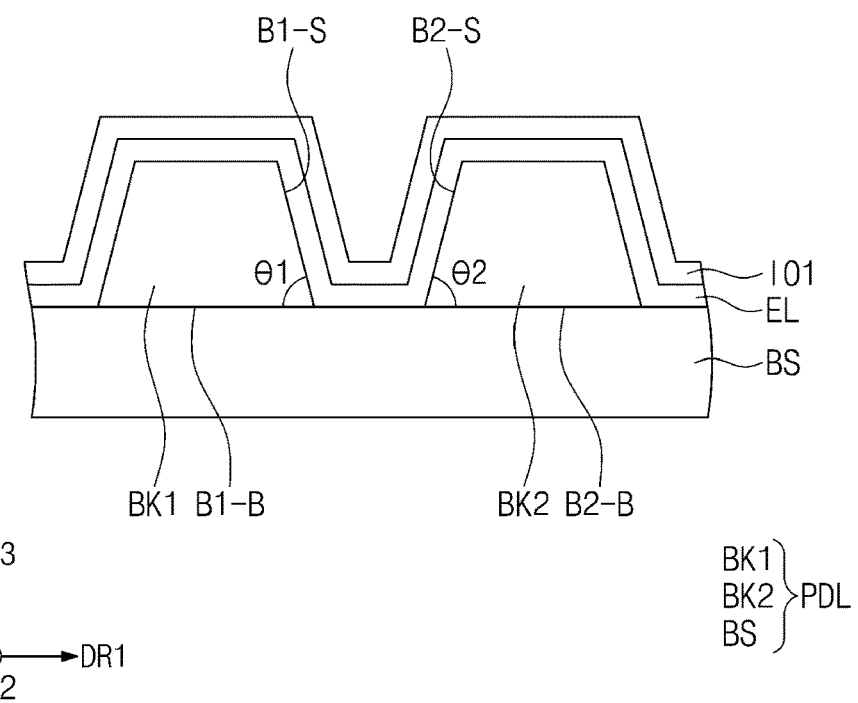
FIG. 5B is a cross-sectional view showing a portion of a display panel according to an embodiment of the present inventive concepts.

FIGS. 5A and 5B are cross-sectional views showing a pixel definition layer, a common layer, and a first inorganic layer according to an embodiment of the present inventive concepts. The pixel definition layer PDL, the common layer EL, and the first inorganic layer IO1 include substantially the same configurations as those shown in the embodiments of FIGS. 2 to 4B, and thus, a description of substantially similar elements described with reference to FIGS. 2 to 4B may be applied to the pixel definition layer PDL, the common layer EL, and the first inorganic layer IO1 of the embodiments of FIGS. 5A and 5B and may not be repeated for convenience of explanation. Referring to the embodiments of FIGS. 5A and 5B, a shape of a first barrier portion BK1 and a shape of a second barrier portion BK2, which are included in the pixel definition layer PDL, will be mainly described.

Referring to the embodiments of FIGS. 5A and 5B, the first barrier portion BK1 may include a lower surface B1-B and a first lateral surface B1-S. The second barrier portion BK2 may include a lower surface B2-B and a second lateral surface B2-S. Each of the lower surface B1-B of the first harder portion BK1 and the lower surface B2-B of the second barrier portion BK2 may be substantially parallel to a plane defined b the first direction DR1 and the second direction DR2. The lower surfaces B1-B, B2-B of the first and second barrier portions BK1, BK2 may be substantially parallel with an upper surface of the base portion BS. The first lateral surface B1-S and the second lateral surface B2-S may be spaced apart from each other in the first direction DR1 and may face each other.

As shown in the embodiment of FIG. 5A, an angle between the lower surface B1-B and the first lateral surface B1-S of the first barrier portion BK1 may be defined as a first angle $\theta1$, and an angle between the lower surface B2-B and the second lateral surface B2-S of the second barrier portion BK2 may be defined as a second angle θ2. In an embodiment, each of the first angle θ1 and the second angle θ2 may be in a range of about 45 degrees to about 180 degrees.

In the embodiment of FIG. 5A, the first barrier portion BK1 and the second barrier portion BK2 have a first angle θ1 and second angle θ2, respectively, that are both greater than about 90 degrees. In the embodiment of FIG. 5B, the first barrier portion BK1 and the second barrier portion BK2 have the first angle θ1 and the second angle θ2, respectively, that are both less than about 90 degrees. As shown in the embodiment of FIG. 4A, the first angle θ1 and the second angle θ2 may be about 90 degrees, and the first lateral surface B1-S and the second lateral surface B2-S may be substantially parallel to each other.

The first angle θ1 and the second angle θ2 may exert an influence on a frictional force between the common layer EL and the first inorganic layer IO1 or a frictional force between the pixel definition layer PDL and the first inorganic layer IO1, which are disposed on the first lateral surface B1-S and the second lateral surface B2-S. As the first angle θ1 and the second angle θ2 increase, the frictional force at an interface between components increases, and as the frictional force increases, the components may be more difficult to be separated from each other. Accordingly, the delamination defect between the common layer EL and the first inorganic layer IO1, which are disposed on the first and second barrier portions BK1 and BK2, may be reduced or prevented by adjusting the first angle θ1 and the second angle θ2.

Figure 6:
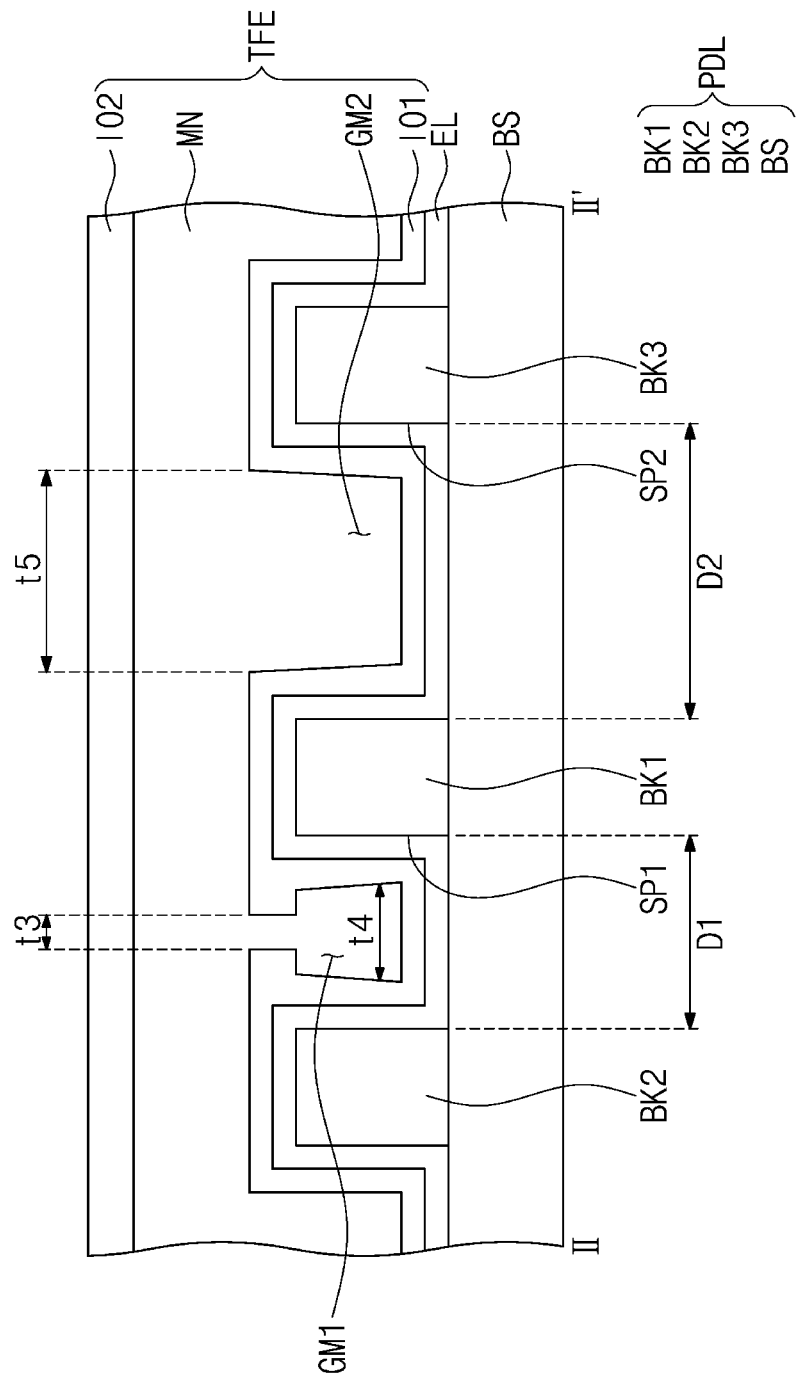
FIG. 6 is a cross-sectional view taken along line II-II' of FIG. 3 showing a portion of a display panel according to an embodiment of the present disclosure.

FIG. 6 is a cross-sectional view taken along line II-II' of FIG. 3 to show a pixel definition layer and at encapsulation layer. The pixel definition layer PDL may include first, second, and third barrier portions BK1, BK2, and BK3. The first barrier portion BK1 may be spaced apart from the second barrier portion BK2 (e.g., in the first direction DR1) and may define a first space SP1 having a first distance D1 in the first direction DR1 (or a first length D1 in the first direction DR1). The third barrier portion BK3 may be spaced apart from the first barrier portion BK1 (e.g., in the second direction DR2) and may define a second spaces SP2 having a second distance D2 in the second direction DR2 (or a second length D2 in the second direction DR2).

A plurality of barrier portions, such as the first to third barrier portions BK1, BK2, and BK3, included in the pixel definition layer PDL and adjacent to each other may be spaced apart from each other at different distances. For example, as shown in the embodiment of FIG. 6, the first distance D1 may be less than the second distance D2. A first inorganic layer IO1 deposited to overlap the space having a relatively larger distance may be easily deposited at a relatively uniform thickness.

The adhesion between the pixel definition layer PDL, a common layer EL, and the first inorganic layer IO1 may increase by the first inorganic layer IO1 disposed to overlap the space defined by the barrier portions. Accordingly, the delamination defect between the pixel definition layer PDL, the common layer EL, and the first inorganic layer IO1 may be reduced or prevented.

The deposition shape of the first inorganic layer IO1 overlapping the spaces formed with different distances may be different from each other to correspond to the spaces. Thus, grooves defined by the upper surface of the first inorganic layer IO1 overlapping the spaces formed with different distances may have different widths and different shapes.

A first groove GM1 may be defined by the upper surface of the first inorganic layer IO1 overlapping the first space SP1, and a second groove GM2 may be defined by the upper surface of the first inorganic layer IO1 overlapping the second space SP2. The first groove GM1 and the second groove GM2 may have different shapes from each other.

The first groove GM1 may have a shape in which a width t3 (e.g., length in the first direction DR1) of an upper portion of the first groove GM1 is less than a width t4 (e.g. length in the first direction DR1) of a lower portion of the first groove GM1. The second groove GM2 may have a shape in which a width t5 (e.g., length in the second direction DR2) of an upper portion of the second groove GM2 is equal to or similar to a width (e.g., length in the second direction DR2) of a lower portion of the second groove GM2, or the width t5 of the upper portion of the second groove GM2 may be greater than the width of the lower portion of the second groove GM2.

An organic layer MN filled in the first groove GM1 having the width t3 of the upper portion that is relatively small does not easily come out from the first groove GM1, and thus, the first inorganic layer IO1 and the organic layer MN may not be easily separated from each other. The organic layer MN filled in the second groove GM2 whose width t5 of the upper portion is relatively greater than the width t3 of the upper portion of the first groove GM1 may be sufficiently filled in the space defined as the second groove GM2 without leaving an empty space.

In an embodiment, the first space SP1 and the second space SP2 may be a space formed integrally and may not be discrete and separated from each other. Accordingly, the first groove GM1 and the second groove GM2 defined by the upper surface of the first inorganic layer IO1 may be defined integrally.

Figure 7A:
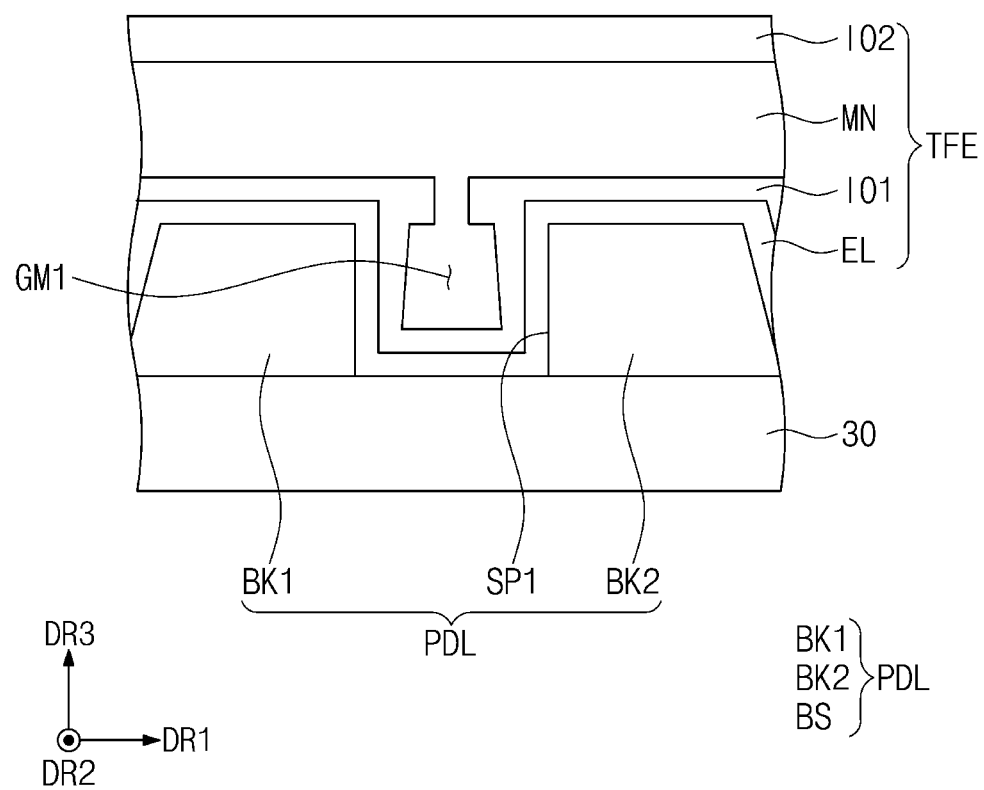
FIG. 7A is a cross-sectional view showing a portion of a display panel according to an embodiment of the present inventive concepts.
Figure 7B:
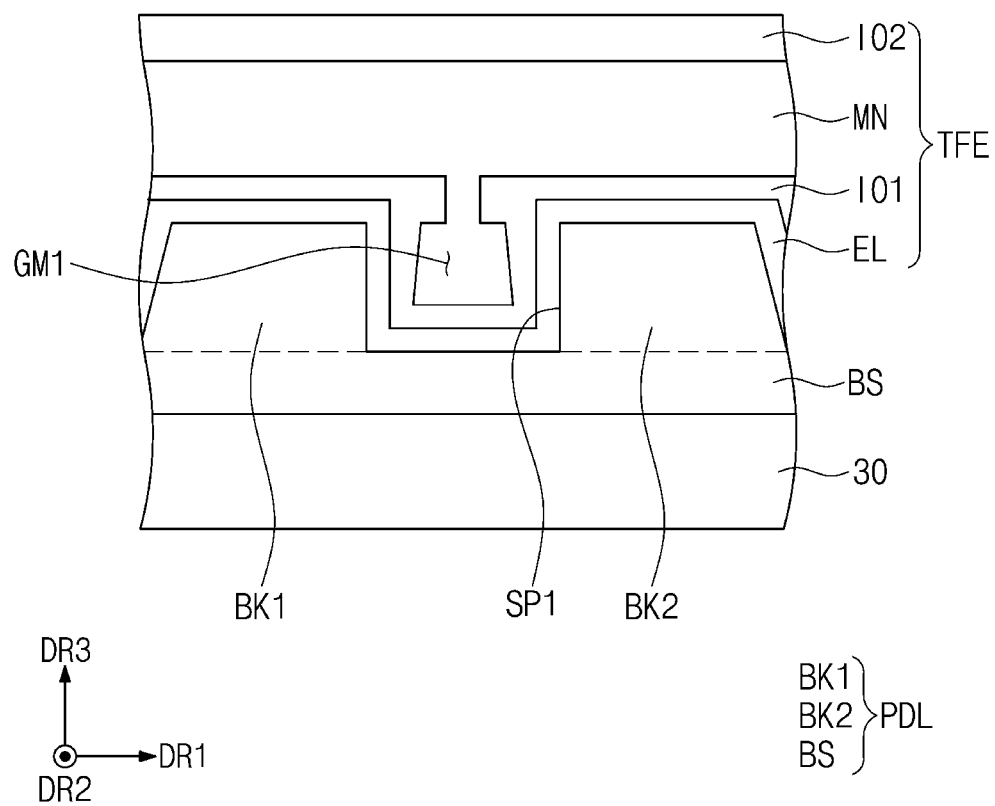
FIG. 7B is a cross-sectional view showing a portion of a display panel according to an embodiment of the present inventive concepts.

FIGS. 7A and 7B show a pixel definition layer and an encapsulation layer according to an embodiment of the present inventive concepts. Components include substantially the same configurations as those of the embodiments of FIGS. 2 to 4B, and thus, the descriptions with reference to the embodiments FIGS. 2 to 4B may be applied to the components of FIGS. 7A and 7B and a repeated description may not be provided for convenience of explanation. In the embodiments of FIGS. 7A and 7B the pixel definition layer PDL is different from that shown in the embodiment of FIG. 4A, and different features from the pixel definition layer PDL of the embodiment of FIG. 4A will be mainly described.

In the pixel definition layer PDL shown in the embodiment of FIG. 7A, the base portion BS may be omitted. A plurality of barrier portions, such as the first and second barrier portions BK1 and BK2, included in the pixel definition layer PDL may be disposed to be in direct contact with an upper surface of the third insulating layer 30.

A first barrier portion BK1 and a second barrier portion BK2, which are spaced apart from each other to define a predetermined first space SP1, may directly contact the upper surface of the third insulating layer 30 included in the circuit layer DP-CL (refer to FIG. 2). A lower surface of the common layer EL disposed to overlap the first space SP1 may directly contact the upper surface of the third insulating layer 30. Outer lateral sides of the first barrier portion BK1 and the second barrier portion BK2 may extend at an oblique angle with respect to the upper surface of the third insulating layer 30.

The pixel definition layer PDL shown in the embodiment of FIG. 7B may include a base portion BS and a plurality of barrier portions, such as first and second barrier portions BK1 and BK2, that are integrally formed with the base portion BS. For example, in an embodiment, the first and second barrier portions BK1 and BK2 of the pixel definition layer PDL may be formed by etching portions of a layer with a flat upper surface. The base portion BS and the first and second barrier portions BK1 and BK2 may include the same material. However, embodiments of the present inventive concepts are not limited thereto and the pixel definition layer PDL may vary. For example, the pixel definition layer may be formed by disposing the first and second barrier portions BK1 and BK2 on the base portion BS with the flat upper surface, and the base portion BS may include a material that is different from that of the first and second barrier portions BK1 and BK2.

FIGS. 8A to 8C are plan views showing pixel definition layers according to embodiments of the present inventive concepts. FIGS. 8A to 8C show various shapes of a plurality of barrier portions in a plane according to various embodiments of the present inventive concepts. For convenience of explanation, the barrier portions are shaded in the illustration.

Each of the first to fourth barrier portions BK1, BK2, BK3, and BK4 may be provided in plural and may have a pattern shape in a plane. Various examples of the first to fourth barrier portions BK1, BK2, BK3, and BK4 having the pattern shape are shown in the embodiments of FIGS. 8A to 8C. However, embodiments of the present inventive concepts are not limited thereto and the pattern shape may vary provided the pattern is formed by the first to fourth barrier portions BK1, BK2, BK3, and BK4 arranged in a certain rule.

As shown in the embodiment of FIG. 8A, predetermined first and second spaces SP1 and SP2 defined by the first to fourth barrier portions BK1, BK2, BK3, and BK4 may be arranged in a radial shape with respect to an imaginary center CP when viewed in a plane. In the present specification, the term "radial shape" means a shape in which the spaces extend in several directions with respect to the imaginary center CP.

Referring to the embodiments of FIGS. 8A and 8B, a width D3 of the first, space SP1 may be different from a width D4 of the second space SP2 when viewed in a plane. The first and second spaces SP1 and SP2 having different widths may be integrally formed with each other.

As shown in the embodiment of FIG. 8B, the second space SP2 may extend longitudinally substantially in the first direction DR1 and the second direction DR2 crossing the first direction DR1 at the imaginary center CP. The first space SP1 may extend in a diagonal direction between the first direction DR1 and the second direction DR2 with respect to the imaginary center CP. However, the shape in plane of the predetermined space defined by the first to fourth barrier portions BK1, BK2, BK3, and BK4 should not be particularly limited as long as the shape is defined by the barrier portions spaced apart from each other.

The first to fourth barrier portions BK1, BK2, BK3, and BK4 may have various shapes in a plane and should not be particularly limited. For example, in an embodiment, each of the first to fourth barrier portions BK1, BK2, BK3, and BK4 may have a triangular shape, a quadrangular shape, or a fan shape when viewed in a plan view.

The first to fourth barrier portions BK1, BK2, BK3, and BK4 may have the sat e area as each other or different areas from each other in a plane. The embodiment of FIG. 8C shows a pixel definition layer PDL of which a partial portion of the barrier portions have the same area as each other in a plane and a partial portion of the barrier portions have different areas from each other in a plane. Referring to the embodiment of FIG. 8C, a first barrier portion BK1 may have substantially the same area as that of a fourth barrier portion BK4 and may have a different area from that of each of a second barrier portion BK2 and a third barrier portion BK3. The second and third barrier portions BK2, BK3 may have the same area as each other which is smaller than the area of the first and fourth barrier portions BK1, BK4.

As described with reference to the embodiment of FIG. 3, the barrier portions disposed adjacent to each other may be defined as one barrier group BKG-a, BKG-b, or BKG-c. Each of the shape of the barrier groups BKG-a, BKG-b, and BKG-c, which are obtained by connecting the outer sides of the barrier portions disposed adjacent to each other and the space defined by the barrier portions in a plane, may be various shapes. For example, the barrier group BKG-a shown in the embodiment of FIG. 8A may have a lozenge shape, the barrier group BKG-b shown in the embodiment of FIG. 8B may have an oval shape, and the barrier group BKG-c shown in the embodiment of FIG. 8C may have a quadrangular shape. However, embodiments of the present inventive concepts are not limited to the shapes of the barrier groups shown in the embodiments of FIGS. 8A to 8C and the shapes of the barrier groups may vary.

The display panel according to an embodiment of the present inventive concepts may include the pixel definition layer including the barrier portions spaced apart from each other to define the predetermined space, the inorganic layer disposed on the pixel definition layer to correspond to the shape of the pixel definition layer, and the groove defined by the upper surface of the inorganic layer which may have a variety of shapes by varying the thickness of the inorganic layer disposed to overlap the predetermined space depending on its position, and the organic layer disposed on the inorganic layer. The delamination defect between the inorganic layer and the components of the light emitting element layer in direct contact with the lower surface of the inorganic layer may be reduced or prevented by the inorganic layer disposed to overlap the predetermined space, and the delamination defect between the inorganic layer and the organic layer may be reduced or prevented by the organic layer filled in the groove defined by the upper surface of the inorganic layer. Accordingly, the delamination defect between the components in the display panel of the present inventive concepts may be reduced or prevented even though the display panel is repeatedly folded or unfolded, and the reliability of the display panel may be increased.

Although embodiments of the present inventive concepts have been described, it is understood that the present inventive concepts should not be limited to these embodiments but various changes and modifications can be made by one ordinary skilled in the art within the spirit and scope of the present inventive concepts.

Therefore, the present inventive concepts should not be limited to any single embodiment described herein.

What is claimed is:

1. A display panel comprising:
   a light emitting element layer comprising a pixel definition layer having an opening defined therethrough and a light emitting element disposed in the opening;
   the pixel definition layer comprises a base portion and first and second barrier portions that are disposed on the base portion and extend above the base portion, the opening is defined through the base portion and the first and second barrier portions are spaced apart from each other in a first direction to define a first space above the base portion, the first space having a first length in the first direction; and a first inorganic layer covering the light emitting element layer, the first inorganic layer comprising an uneven upper surface corresponding to the first space; and an organic layer in contact with an upper surface of the first inorganic layer, wherein a first groove is defined by the upper surface of the first inorganic layer overlapping the first space, a thickness of the first inorganic layer overlapping the first space varies, and the organic layer is filled in the first groove.

2. The display panel of claim 1, wherein:

the first inorganic layer overlapping the first space comprises a first portion disposed substantially parallel to the light emitting element layer, a second portion bent from the first portion, and a third portion bent from the first portion, the third portion is spaced apart from the second portion and faces the second portion, wherein an upper portion of each of the second portion and the third portion has a thickness that is greater than a thickness of a lower portion of each of the second portion and the third portion.

3. The display panel of claim 1, wherein a width of an upper portion of the first groove is smaller than a width of a lower portion of the first groove.

4. The display panel of claim 1, further comprising a third barrier portion that is spaced apart from the first barrier portion to define a second space having a second length in a second direction crossing the first direction, wherein the second length is greater than the first length.

5. The display panel of claim 4, wherein:

a second groove is defined by the upper surface of the first inorganic layer overlapping the second space; and a width of an upper portion of the second groove is greater than a width of an upper portion of the first groove.

6. The display panel of claim 4, wherein the first space and the second space are integral with each other.

7. The display panel of claim 5, wherein the width of the upper portion of the second groove is greater than or equal to a width of a lower portion of the second groove.

8. The display panel of claim 5, wherein the first groove and the second groove are integral with each other.

9. The display panel of claim 1, wherein each of the first barrier portion and the second barrier portion has a triangular shape, a quadrangular shape, or a fan shape in a plane.

10. The display panel of claim 1, wherein:

the first barrier portion comprises a lower surface and a first lateral surface;

the second barrier portion comprises a lower surface and a second lateral surface facing the first lateral surface, and wherein each of a first angle between the lower surface of the first barrier portion and the first lateral surface of the first barrier portion and a second angle between the lower surface of the second barrier portion and the second lateral surface of the second barrier portion is in a range of about 45 degrees to about 180 degrees.

11. The display panel of claim 10, wherein the first lateral surface is parallel to the second lateral surface.

12. The display panel of claim 1, wherein the base portion is in direct contact with a lower surface of each of the first barrier portion and the second barrier portion, the base portion includes the opening defined therethrough.

13. The display panel of claim 12, wherein the first barrier portion and the second barrier portion are integral with the base portion.

14. The display panel of claim 1, wherein each of the first barrier portion and the second barrier portion is provided in plural, and the plurality of the first and second barrier portions form a pattern shape in a plane.

15. The display panel of claim 4, wherein the first space and the second space have a radial shape in a plane.

16. The display panel of claim 1, wherein the light emitting element comprises:

a first electrode having at least a partial portion exposed through the opening;

a light emitting layer disposed on the first electrode; and a second electrode disposed on the light emitting layer, wherein the second electrode is disposed on the pixel definition layer to correspond to a shape of an upper surface of the pixel definition layer.

17. The display panel of claim 16, wherein the light emitting element further comprises:

a hole control layer disposed between the first electrode and the light emitting layer; and an electron control layer disposed between the light emitting layer and the second electrode.

18. The display panel of claim 1, further comprising a second inorganic layer disposed on the organic layer.

19. The display panel of claim 1, wherein the display panel further comprises a foldable base layer disposed under the light emitting element layer.

20. A display panel comprising:

a light emitting element layer comprising a pixel definition layer having an opening defined therethrough and a light emitting element disposed in the opening, and the pixel definition layer comprises a base portion and a plurality of barrier portions that are disposed on the base portion and extend above the base portion, the opening is defined through the base portion and the plurality of barrier portions are spaced apart from each other to form a predetermined space above the base portion, wherein adjacent barrier portions of the plurality of barrier portions form a plurality of barrier groups;

a first inorganic layer covering the light emitting element layer and disposed to correspond to the predetermined space;

each of the plurality of barrier groups includes at least one first groove defined by the upper surface of the first inorganic layer overlapping the predetermined space, the at least one first groove has an upper portion having a smaller width than a width of a lower portion of the at least one first groove; and an organic layer is in direct contact with an upper surface of the first inorganic layer and fills the at least one first groove.

* * * * *